United States Patent [19]

Galla

[11] Patent Number: 5,281,326

[45] Date of Patent: Jan. 25, 1994

[54] METHOD FOR COATING A DIELECTRIC CERAMIC PIECE

[75] Inventor: Elli K. Galla, Muhos, Finland

[73] Assignee: LK-Products OY, Kempele, Finland

[21] Appl. No.: 855,629

[22] PCT Filed: Sep. 18, 1991

[86] PCT No.: PCT/FI91/00284

§ 371 Date: Apr. 30, 1992

§ 102(e) Date: Apr. 30, 1992

[87] PCT Pub. No.: WO92/05127

PCT Pub. Date: Apr. 2, 1992

[30] Foreign Application Priority Data

Sep. 19, 1990 [FI] Finland .................................. 904623

[51] Int. Cl.$^5$ .................................................. C25D 5/00
[52] U.S. Cl. ...................................... 205/163; 205/162; 205/183; 205/184
[58] Field of Search ................ 205/162, 163, 183, 184

[56] References Cited

U.S. PATENT DOCUMENTS

| | | | |
|---|---|---|---|
| 3,607,681 | 9/1971 | Cooke et al. | 205/163 |
| 3,865,558 | 2/1975 | Roth et al. | 205/163 |
| 4,668,925 | 5/1987 | Towatari et al. | 205/163 |
| 4,748,086 | 5/1988 | Akoh | 205/163 |
| 4,808,274 | 2/1989 | Nguyen | 205/183 |
| 5,066,620 | 11/1991 | Sunahara et al. | 501/7 |

OTHER PUBLICATIONS

Lowenheim, F. A., "Modern Electroplating", 3rd edition, John Wiley & Sons, Inc., New York, pp. 571–583.
F. A. Lowenheim, "Electroplating", McGraw-Hill, Inc., New York, 1978, pp. 416–418.
Eiichi Asada et al., Electrically Conductive Composition for Terminal Electrode on Ceramic Electric Capacitor, Chem. Abstr., vol. 112, 244499s.
Hisano Nakakura et al., Laminated Ceramic Capacitor Having Triple-Layered Outer Electrode, Chem. Abstr., vol. 114, 134461g and vol. 114, 113458w.
Chemical Abstracts, vol. 112, No. 26, Jun. 25, 1990, (Columbus, Ohio, U.S.), p. 626, Abstract 244499s, & JP, A, 239410 (Eiichi Asada et al.).
Dialog Information Services, File 351, World Patent Index 81–91, Dialog Accession No. 003174565, KKC. KK, "Ceramic Capacitor Mfr. by Depositing Silver Paste Layers on Dielectric Ceramic Body, Firing to Form Silver Electrodes and Forming Nickel and Solder Layers", JP 56030718, A, 810327, 8120 (Basic).

*Primary Examiner*—John Niebling
*Assistant Examiner*—Kishor Mayekar
*Attorney, Agent, or Firm*—Darby & Darby

[57] ABSTRACT

A method for coating a dielectric ceramic piece by a layer of electrical conductivity whereby the method consists of coating the ceramic piece with an electrically conductive paste and of growing a metal layer of good electrical conductivity upon this layer.

6 Claims, No Drawings

METHOD FOR COATING A DIELECTRIC CERAMIC PIECE

BACKGROUND OF THE INVENTION

The present invention refers to a method with the objective of forming a layer with good electrical conductivity to different dielectric ceramic materials. In particular, the invention refers to a method for providing ceramic components for microwave band applications, e.g. ceramic resonators to be used in duplex filters and in the receiver front end pass filters. The advantages of these ceramic components are their small sizes and their minimal losses and their excellent stability.

Whenever ceramic materials are used in the microwave band, good electrical conductivity, corrosion resistance, and good adhesion of the ceramic surface are required of the coating.

The most commonly used coating methods today are coating by wire paste and chemical coating (wet process). Paste coating is a relatively expensive process. Chemical coating has several phases and may influence the electrical characteristics of the ceramic material. In order to obtain sufficient adhesion, the first etching treatments in the chemical coating process are different when different ceramic materials are used and therefore they have to be established separately for every material. In some cases, it is possible to provide the adhesive layer by sputtering, but this method is difficult in connection with components with deep holes or cavities.

The German application publication DE-3706951 discloses a method concerning metal coating of ceramic materials. According to this method, a thin metal coating is formed on the ceramic material by currentless coating, the metal coating is heat-treated and chemically etched to improve the adhesion, after which the surface of the ceramic material is metal-coated by a currentless coating process. This process includes several phases and different process phases should be applied to different ceramic materials.

SUMMARY OF THE INVENTION

The objective of the present invention is to provide a method by which the above mentioned disadvantages could be eliminated. The essential characteristics of the invention are described in the attached claims.

The advantage of the method according to the present invention is, in comparison with the methods of prior art, is also the fact that the Q values reached by it in the resonator applications is better (the quality factor or the relation between the energy stored in the field and the energy lost in the dissipation during one phase). The coating method according to the invention is considerably simpler than the chemical coating method, and the coating obtained by it will be significantly cheaper than by the coating method with the paste method. This is due to the fact that most of the conducting coating is obtained by electrolytical incrementation.

In the method according to the invention, the ceramic piece of the desired form is first washed by an organic detergent in the ultrasound washing machine. The detergent could, for instance, be an acetone or an isopropanol. The ceramic material used could be any generally used ceramic material used in the branch; the chemical composition is not essential, as far as the method itself is concerned. After washing the pieces are dried. Then the pieces are coated by a paste with good electrical conductivity. The paste can be e.g. a silver paste, a commercial product including about 80 percent silver, terpineol, leaded glass and a solution. The silver paste layer is sintered by having the paste coated piece in the temperature of 300° C., then by rising the temperature to 850° C. for 20 minutes, and then further to 900° C. for 5 minutes, after which the piece will be held in 900° C. for 15 minutes, and cooled after that. The silver paste thus created has a thickness of about 5 to 10 $\mu$m and it will work as an adhesive layer between the ceramic material and the coating with electrical conductivity. Another example of a paste with electrical conductivity is a copper paste that can replace, when desired, the silver paste.

The etching of the ceramic surface is not necessary at all before coating. A thin paste layer will replace the adhesive layer obtained by the multiphased chemical coating method.

After sintering, a silver or a copper and a tin-lead coating is grown electrolytically on the thin paste layer, the thickness of which should be, to obtain a good Q value, about 10 to 20 $\mu$m. Tin alone may be used as the electrolytic metal coating.

In the following, the invention will be described in a more detailed way with an example where the charged Q values of the coated ceramic pieces obtained by the coating method according to this invention are compared with the Q values of pieces coated by other methods.

DESCRIPTION OF THE PREFERRED EMBODIMENT

Identical ceramic pieces were coated in four different ways:

1. A ceramic coating with copper on which a layer of copper + tin-lead was grown electrolytically; total layer thickness 25 to 30 $\mu$m (Table I).
2. A coating with silver paste; layer thickness 25 to 30 $\mu$m (Table II).
3. A coating first with silver paste, on which a layer of copper (15 $\mu$m)—tin-lead (5 $\mu$m) was grown electrolytically. The Q values were measured after both the copper and the tin-lead layers (Table III).
4. A coating made first with a silver paste, on which a layer of silver (20 to 30 $\mu$m) was grown electrolytically (Table IV).

The electrolytical copper coating was obtained by a normal high-polish coppering process including 200 g/l copper sulphate, 35 ml/l concentrated sulphur acid, 0.17 ml/l (concentr.) hydrochloric acid, and the brightness additives of Lea Ronal. The current density was 0.5 A/dm$^2$ and the precipitation rate about 10 $\mu$m/1 h.

The electrolytical tin-lead coating was obtained by an acid tin-lead bath containing 12 mg/l tin, 6 mg/l lead, 280 ml/l alkyl sulphone acid, plus the brightness additives of Lea Ronal. The current density was 2 A/dm$^2$ and the precipitation rate about 0.2 $\mu$m/1 min.

TABLE I

| Piece | Q Values | Frequency, MHz |
| --- | --- | --- |
| 1 | 480 | 967.3 |
| 2 | 500 | 971.7 |
| 3 | 480 | 973.2 |
| 4 | 480 | 972.2 |
| 5 | 480 | 971.1 |

TABLE II

| Piece | Q Values | Frequency, MHz |
| --- | --- | --- |
| 1 | 560 | 963.7 |
| 2 | 560 | 975.0 |

TABLE II-continued

| Piece | Q Values | Frequency, MHz |
|---|---|---|
| 3 | 570 | 971.4 |
| 4 | 570 | 975.1 |
| 5 | 550 | 968.7 |
| 6 | 550 | 978.6 |
| 7 | 560 | 973.9 |
| 8 | 550 | 971.1 |
| 9 | 550 | 972.8 |
| 10 | 560 | 970.0 |
| 11 | 560 | 971.0 |

TABLE III

| Piece | Q Value after coppering | Q Value +tin-lead | Frequency, MHz |
|---|---|---|---|
| 1 | 590 | 580 | 975.9 |
| 2 | 590 | 580 | 978.6 |
| 3 | 590 | 580 | 976.1 |
| 4 | 590 | 570 | 971.6 |
| 5 | 590 | 580 | 975.0 |
| 6 | 600 | 580 | 979.0 |
| 7 | 610 | 590 | 976.7 |

TABLE IV

| Piece | Q Value | Frequency, MHz |
|---|---|---|
| 1 | 600 | 975.9 |
| 2 | 600 | 993.8 |
| 3 | 590 | 974.1 |
| 4 | 600 | 971.3 |
| 5 | 610 | 975.0 |
| 6 | 600 | 977.8 |
| 7 | 610 | 973.2 |
| 8 | 600 | 973.1 |
| 9 | 600 | 978.1 |

The results in Tables I to IV show that the best Q values are obtained by a coating consisting of one paste middle layer and an electrolytical silver coating. The Q value of this coating is about 7 to 10 percent higher than the Q value obtained by a simple paste layer of the same thickness. The Q value of a coating consisting of a paste middle layer and an electrolytical copper+tin-lead coating is nearly as good as the Q value of a coating consisting of a paste middle layer and an electrolytical silver coating.

Assessing the adhesion, it was noted that with the electrolytical coatings the adhesion obtained will be as good as with the paste coatings alone.

I claim:

1. A method of forming a ceramic component which has characteristics useful in a microwave band application, comprising the steps of:

coating a dielectric ceramic body with a layer of a paste having electrical conductivity, the paste being selected from the group consisting of a silver and copper paste; and subsequently a growing electrolytically an electrically conductive metal layer upon the coated layer, the metal layer being selected from the group consisting of a silver layer, a copper and tin-lead layer, and a tin layer.

2. A method as in claim 1, wherein the silver paste coats the ceramic body, the silver paste having a thickness between about 5 to 10 micrometers.

3. A method as in claim 1, wherein the metal layer has a thickness between about 10 to 20 micrometers.

4. A method as in claim 1, further comprising the step of washing the dielectric ceramic body with an organic detergent and then drying the washed dielectric ceramic body before the step of coating.

5. A method as in claim 1, wherein the step of coating includes sintering and then cooling the paste.

6. A method as in claim 1, wherein the steps of coating and growing are performed so that the ceramic component has Q values which permit the ceramic component to serve as a ceramic resonator in the microwave band application.

* * * * *